(12) United States Patent
Rudmann et al.

(10) Patent No.: US 9,899,251 B2
(45) Date of Patent: Feb. 20, 2018

(54) USE OF VACUUM CHUCKS TO HOLD A WAFER OR WAFER SUB-STACK

(71) Applicant: Heptagon Micro Optics Pte. Ltd., Singapore (SG)

(72) Inventors: Hartmut Rudmann, Jona (CH); Stephan Heimgartner, Passugg (CH); John A. Vidallon, Singapore (SG)

(73) Assignee: Heptagon Micro Optics Pte. Ltd., Singapore (SG)

( * ) Notice: Subject to any disclaimer, the term of this patent is extended or adjusted under 35 U.S.C. 154(b) by 0 days.

(21) Appl. No.: 15/698,991

(22) Filed: Sep. 8, 2017

(65) Prior Publication Data

US 2018/0005864 A1 Jan. 4, 2018

(51) Int. Cl.
*H01L 21/68* (2006.01)
*H01L 21/683* (2006.01)
*B32B 37/18* (2006.01)
*B32B 38/18* (2006.01)
*B32B 37/12* (2006.01)

(52) U.S. Cl.
CPC .......... *H01L 21/6838* (2013.01); *B32B 37/12* (2013.01); *B32B 37/18* (2013.01); *B32B 38/1858* (2013.01); *B32B 2457/00* (2013.01); *B32B 2551/00* (2013.01)

(58) Field of Classification Search
CPC ..... H01L 24/00–24/98; H01L 41/312–41/313; H01L 33/0079; H01L 51/0024; H01L 2224/81894–2224/81896; H01L 2224/83894–2224/83896; H01L 2224/1319–2224/13191; H01L 2224/2919–2224/29191; H01L 2224/8385–2224/83885; H01L 21/6838; H01L 2224/751; H01L 2224/761; H01L 2224/771; H01L 2224/781; H01L 2224/791; B25B 11/005
See application file for complete search history.

(56) References Cited

U.S. PATENT DOCUMENTS

| 5,545,283 A | 8/1996 | Collins et al. |
|---|---|---|
| 6,164,633 A | 12/2000 | Mulligan et al. |
| 2008/0054508 A1 | 3/2008 | Rudmann et al. |
| 2011/0013292 A1 | 1/2011 | Rossi et al. |
| 2011/0198817 A1 | 8/2011 | Hurley et al. |
| 2011/0222171 A1 | 9/2011 | Kintz et al. |

FOREIGN PATENT DOCUMENTS

| CN | 101971341 A | 2/2011 |
|---|---|---|
| CN | 102099431 A | 6/2011 |
| CN | 102209622 A | 11/2011 |
| JP | 2006-054286 | 2/2006 |

OTHER PUBLICATIONS

Australian Patent Office, International Search Report and Written Opinion issued in PCT/SG2013/000269 (dated Oct. 16, 2013).
The State Intellectual Property Office of the People's Republic of China, Search Report for Appln. No. 201380035447.6 (dated May 4, 2016) (and translation).

*Primary Examiner* — Scott B Geyer
(74) *Attorney, Agent, or Firm* — Fish & Richardson P.C.

(57) ABSTRACT

Techniques are described for holding a wafer or wafer sub-stack to facilitate further processing of the wafer of sub-stack. In some implementations, a wafer or wafer sub-stack is held by a vacuum chuck in a manner that can help reduce bending of the wafer or wafer sub-stack.

13 Claims, 9 Drawing Sheets

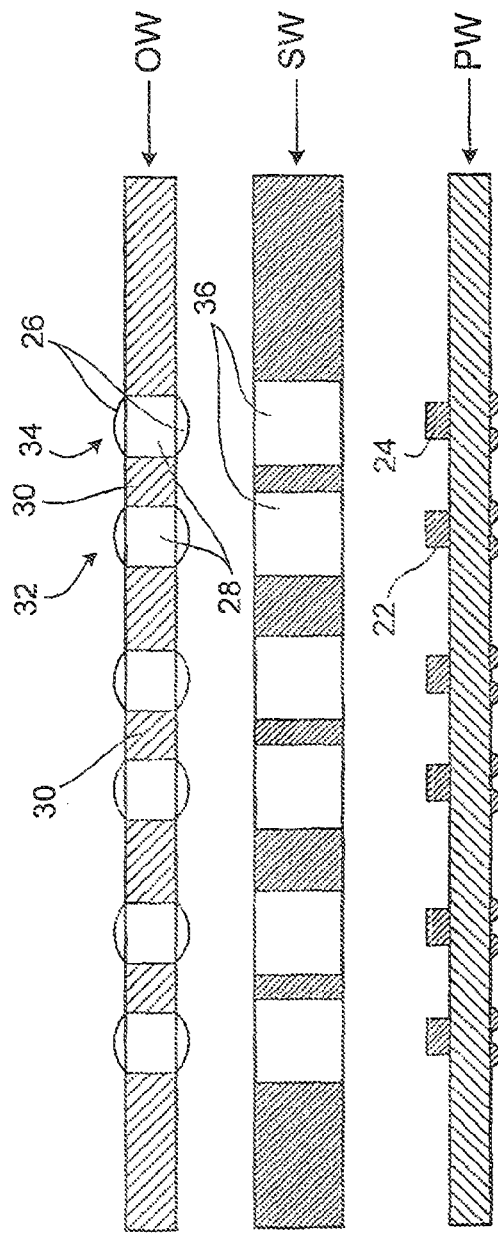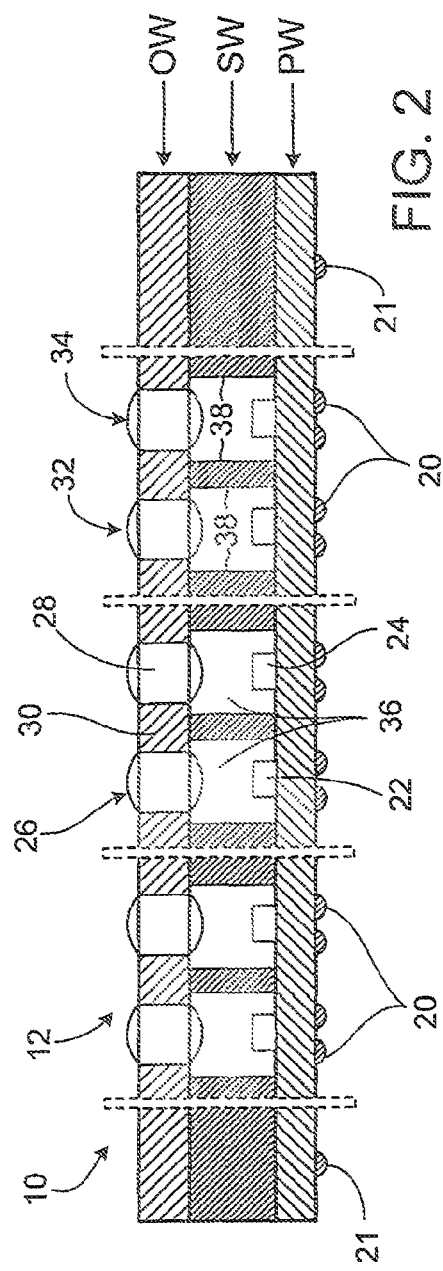

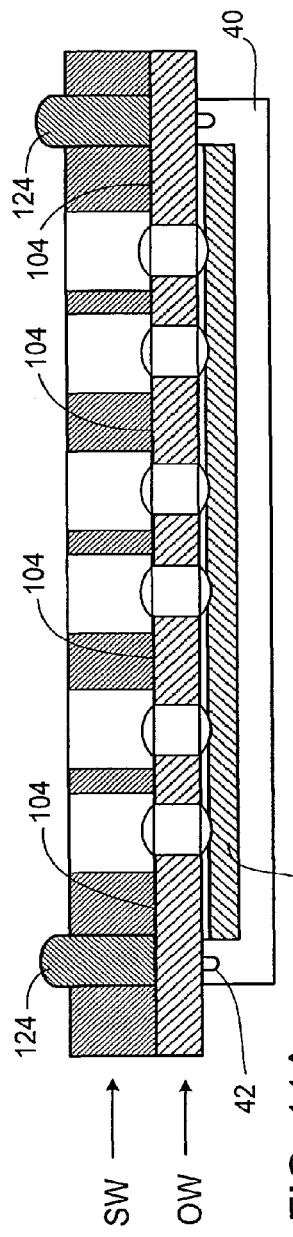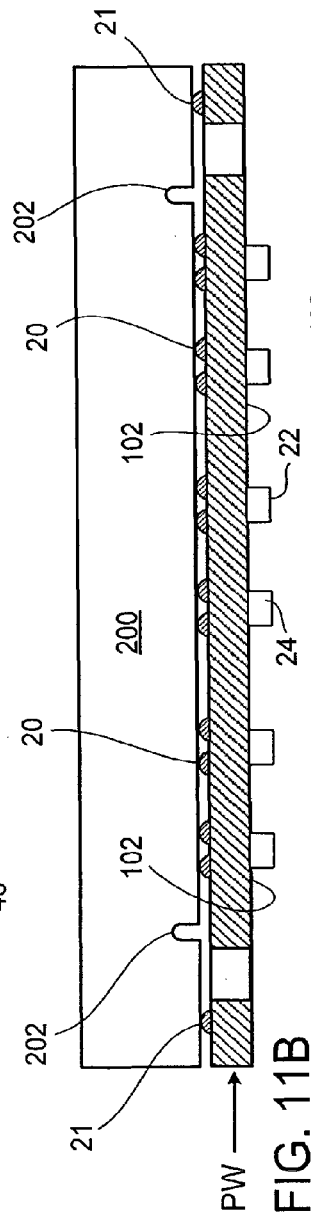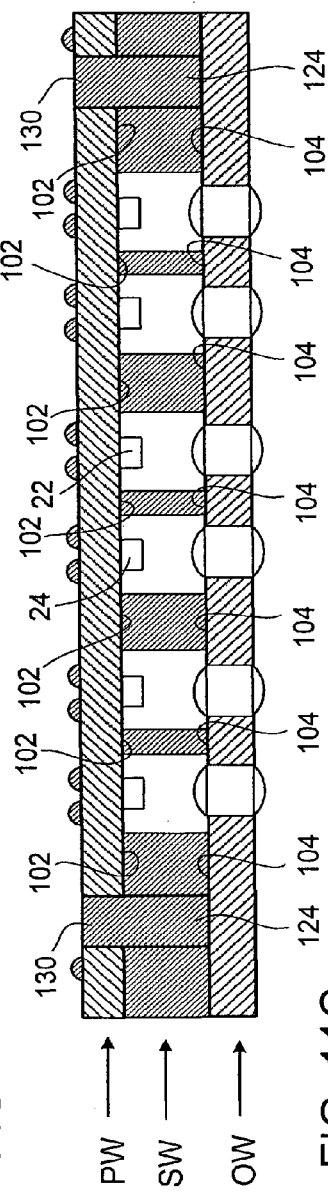

USE OF VACUUM CHUCKS TO HOLD A WAFER OR WAFER SUB-STACK

CROSS-REFERENCE TO RELATED APPLICATION(S)

This application is a continuation of U.S. application Ser. No. 14/408,890, filed on Dec. 17, 2014, which is the National Stage of International Application No. PCT/SG2013/000269, filed on Jun. 28, 2013, which claims the benefit of priority U.S. Application No. 61/667,659, filed on Jul. 3, 2012. The entire contents of the earlier applications are incorporated herein by reference.

FIELD OF THE DISCLOSURE

This disclosure relates to the manufacture and assembly of wafer stacks, such as those used, for example, to fabricate opto-electronic modules.

BACKGROUND

Optical devices such as cameras and integrated camera optics are sometimes integrated into electronic devices such as mobile phones and computers, among others. Manufacturing active and passive optical and electronic components for such devices on a wafer scale is becoming more attractive. One reason is the ongoing trend to reduce the cost of such devices.

Thus, in some applications, the various components are fabricated and assembled on a wafer scale. A wafer scale package, or wafer stack, can include multiple wafers stacked along the smallest wafer dimension (i.e., the axial direction) and attached to one another. The wafer stack may include substantially identical optical or opto-electronic devices arranged side-by-side.

One issue that sometimes occurs during such wafer formation and wafer-scale assembly processes is slight bending (e.g., warping) of the wafers. Such bending may result, for example, because of the relatively small thickness of the wafer or because of the various layers on the wafer, which sometimes are formed in asymmetric arrangements across the surface of the wafer or with different densities on opposite surfaces of the wafer. In some cases, the bending may be as much as 0.5 mm, which reduces the planarity of the wafers and can result in an unacceptable level of non-uniformity in the features across the surface(s) of the wafer. The bending also may adversely impact alignment between wafers when they are stacked one atop the other.

SUMMARY

Techniques are described for holding a wafer or wafer sub-stack to facilitate further processing of the wafer or sub-stack. In some implementations, a wafer or wafer sub-stack is held by a vacuum chuck in a manner that can help reduce bending of the wafer or wafer sub-stack.

For example, in one aspect, a method of forming features on a wafer includes placing a wafer on a vacuum chuck. A first surface of the wafer facing the vacuum chuck includes features that project toward the vacuum chuck, which includes a recessed surface on which a non-sticky, soft, elastic and non-abrasive material (e.g., a Si-based organic, elastomeric polymer such as silicone) is disposed such that the features of the wafer are in contact with the material on the recessed surface of the vacuum chuck. Portions of the first surface of the wafer near its periphery are in contact with an elevated section of the vacuum chuck that includes a vacuum channel. The method includes generating a vacuum to hold the wafer to the vacuum chuck and subsequently bringing a replication tool into contact with a second surface of the wafer to form replicated features on the second surface of the wafer.

According to another aspect, a method of forming a wafer stack includes using a vacuum chuck to hold a first wafer, wherein the vacuum chuck includes a first surface with a vacuum groove. The first surface of the vacuum chuck includes a central region that is encircled by the vacuum groove and an outer region that encircles the vacuum groove. The central region and the outer region of the first surface of the vacuum chuck are at substantially the same height, wherein a first surface of the first wafer that faces the vacuum chuck includes a plurality of features (e.g., bonding pads) thereon that contact the central region of the vacuum chuck's first surface. The first surface of the first wafer further includes a sealing ring that contacts the outer region of the vacuum chuck's first surface. The method includes bringing a second wafer into contact with a second surface of the first wafer, wherein the second surface of the first wafer is on a side of the first wafer opposite its first surface.

According to another aspect, a method of forming optical features on a wafer includes using a first vacuum chuck to hold a wafer and using a second vacuum chuck to hold a frame. The first surface of the wafer has optical elements formed thereon. The frame includes openings whose diameter is slightly larger than a diameter of the optical elements, and a height of the frame is greater than a height of the optical elements. The method includes positioning the wafer and frame such that the optical elements on the wafer are aligned with and fit within the openings of the frame. Alignment of the wafer and frame can be fixed (e.g., by clamps or tape), and the wafer-frame stack can be released by one or both of the vacuum chucks. Subsequently, optical features are formed on a second surface of the wafer, the second surface being on an opposite side of the wafer from the first surface. During formation of the optical features on the second surface, the wafer-frame stack also may be held by a vacuum chuck. The frame can be composed, for example, of a glass-reinforced epoxy laminate material. The optical features (e.g., lens elements) can be formed on the second surface of the wafer, for example, by a replication process.

In yet another aspect, a method of forming a wafer stack includes mounting a first wafer on dicing tape, wherein a first surface of the first wafer includes a plurality of features thereon and a sealing ring encircling the plurality of features. The plurality of features and the sealing ring extend substantially the same distance beyond the first surface of the first wafer. The method also includes using a vacuum chuck to hold the first wafer, wherein the dicing tape is disposed between the vacuum chuck and the first wafer. The vacuum chuck includes a first surface with a vacuum groove, wherein the first surface of the vacuum chuck includes a central region that is encircled by the vacuum groove and an outer region that encircles the vacuum groove, and the central region and the outer region of the first surface of the vacuum chuck are at substantially the same height. The plurality of features on the first surface of the first wafer contact the central region of the vacuum chuck's first surface, and the sealing ring contacts the outer region of the vacuum chuck's first surface.

The disclosed techniques also may be used in connection with a wafer sub-stack that comprises a plurality of wafers stacked on one another.

In some implementations, the disclosed techniques may provide greater mechanical support across the surface of the wafer or wafer sub-stack so that there is little or no bending of the wafer while it is held in place by the vacuum chuck, for example, during a replication or bonding process. In some cases, this can lead to improved uniformity of features across the surface(s) of the wafers and/or better alignment.

Other aspects, features, and advantages will be apparent from the description, the accompanying drawings, and the claims.

BRIEF DESCRIPTION OF DRAWINGS

FIG. 1 is a cross-sectional view of wafers for forming a wafer stack for manufacturing multiple modules.

FIG. 2 is a cross-sectional view of a wafer stack for manufacturing multiple modules.

FIGS. 11A through 11C illustrate an example of steps in formation of a wafer stack using the first and second vacuum chucks.

DETAILED DESCRIPTION

Figure 3:
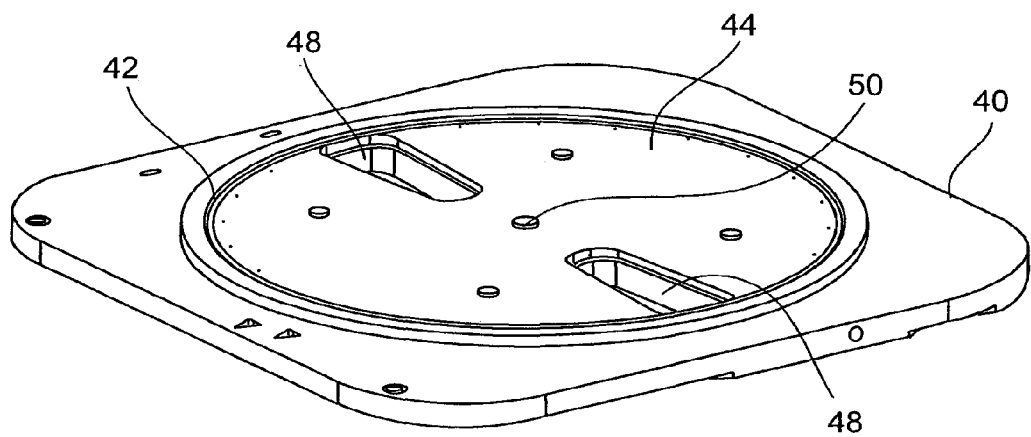
FIG. 3 is an elevated view showing features of a first vacuum chuck.

FIG. 1 shows a schematic cross-sectional view of wafers for forming a wafer stack 10, as shown in FIG. 2. The stacked wafer subsequently can be divided into individual micro-optics structures. For example, as indicated by the vertical dashed lines in FIG. 2, after forming the wafer stack 10, the stack can be diced into multiple modules 12. In the following paragraphs, further details of the illustrated wafers are described. However, the techniques for forming a wafer stack as described in this disclosure can be used to form wafer stacks for other types of modules as well.

In the illustrated example, the stack 10 includes first, second and third wafers PW, SW, OW. Generally, a wafer refers to a substantially disk- or plate-like shaped item, its extension in one direction (z-direction or vertical direction) is small with respect to its extension in the other two directions (x- and y-directions or lateral directions). On a (non-blank) wafer, a plurality of similar structures or items can be arranged, or provided therein, for example, on a rectangular grid. A wafer can have openings or holes, and in some cases a wafer may be free of material in a predominant portion of its lateral area. Depending on the implementation, a wafer may be made, for example, of a semiconductor material, a polymer material, a composite material comprising metals and polymers or polymers and glass materials. The wafers may comprise hardenable materials such as a thermally or ultraviolet (UV) curable polymers. In some implementations, the diameter of a wafer is between 5 cm and 40 cm, and can be, for example between 10 cm and 31 cm. The wafer may be cylindrical with a diameter, for example, of 2, 4, 6, 8 or 12 inches, one inch being about 2.54 cm. The wafer thickness can be, for example, between 0.2 mm and 10 mm, and in some cases, is between 0.4 mm and 6 mm.

Although the wafer stack 10 of FIGS. 1 and 2 show provisions for three modules 12, in some implementations there can be, in one wafer stack, provisions for at least ten modules in each lateral direction, and in some cases at least thirty or even fifty or more modules in each lateral direction. Examples of the dimensions of each of the wafers are: laterally at least 5 cm or 10 cm, and up to 30 cm or 40 cm or even 50 cm; and vertically (measured with no components arranged on substrate wafer PW) at least 0.2 mm or 0.4 mm or even 1 mm, and up to 6 mm or 10 mm or even 20 mm.

In the illustrated example of FIGS. 1 and 2, the first wafer PW is a substrate wafer, the second wafer SW is a spacer wafer, and the third wafer OW is an optics wafer. In other implementations, the wafer stack 10 may include as few as two wafers or may include more than three wafers. Also, the wafers may be of different types than those in the illustrated example.

In the illustrated example, each wafer PW, SW, OW comprises multiple substantially identical members across its surface(s). For example, substrate wafer PW can be a printed circuit board (PCB) assembly comprising standard PCB materials, provided with bonding pads 20 on the one side and with active opto-electronic components 22, 24 soldered to the other side. Bonding pads 20 may be composed of electrical contacts covered with solder paste. In some implementations, the solder paste is applied at a later time.

The active components 22, 24 can be mounted on substrate wafer PW, for example, by pick-and-place using standard pick-and-place machines. Examples of active optical components include a light sensing or a light emitting component, such as a photodiode, an image sensor, an LED, an OLED or a laser chip. For example, an emission member 22 for emitting light (e.g., an optical transmitter die including a light-emitting diode for emitting infrared light or near-infrared light) and a detecting member 24 (e.g., an optical receiver die including a photo diode for detecting infrared light or near-infrared light) for detecting light at the frequency/wavelength (or range of frequencies/wavelengths) emitted by the emission member 22. The active electronic components 22, 24 can be packaged or unpackaged electronic components. For contacting substrate wafer PW, technologies such as wire-bonding or flip chip technology or any other known surface mount technologies may be used, as can conventional through-hole technology.

Passive optical components also may be mounted on the same side of substrate wafer PW as the active components 22, 24. Examples of passive optical components include an optical component that redirects light by refraction and/or diffraction and/or reflection such as a lens, a prism, a mirror or an optical system (e.g., a collection of passive optical components that may include mechanical elements such as aperture stops, image screens or holders).

In the illustrated example, spacer wafer SW has openings 36 such that, when the wafers are stacked to form the wafer stack 10, light emission member 22 and light detecting member 24 are laterally encircled by a wall 38 (see FIG. 2). The spacer wafer SW can help maintain the substrate wafer PW and the optics wafer OW at substantially a constant distance from one another. Thus, incorporating the spacer wafer SW into the wafer stack can enable higher imaging performance and complexity. Wall 38 also can provide protection of detecting member 24 from light emitted by emitting member 22 which should not reach detecting member 24, so as to reduce optical cross-talk between emission member 22 and detecting member 24, by being substantially non-transparent to light generally detectable by detecting member 24. In some implementations, spacer wafer SW is composed of a polymer material, for example, a hardenable (e.g., curable) polymer material, such as an epoxy resin.

In the illustrated example, optics wafer OW includes light blocking portions 30, each of which separates a pair of transparent elements 32, 34, one for allowing light emitted by emission member 22 to leave module 12, and another one for allowing light to enter module 12 from the outside of module 12 and reach detecting member 24. Blocking portion 30 preferably is substantially non-transparent to light generally detectable by detecting member 24.

Each transparent element 32, 34, which can have the same vertical dimension as optics wafer OW, includes a passive optical component such as a lens 28 for light guidance. Respective lens elements 26 are provided above and below each lens 28 to redirect light by refraction and/or by diffraction. For example, lens elements 26 may have a convex shape, although one or more of lens elements 26 may have a different shape, e.g., concave. Lenses 28 and associated lens elements 26 can be arranged, for example, on a rectangular lattice.

In order to provide maximum protection from detecting undesired light, each of the wafers PW, SW, OW can be composed of a material that is substantially non-transparent for light detectable by light detecting members 24, except for areas specifically designed to be transparent (e.g., transparent elements 32, 34).

The lens elements 26 of the optics wafer OW can be formed, for example, using a double-sided replication process. An example of a replication process is described in U.S. Patent Publication No. 2008/0054508. For example, a replication tool used for the replication process can include replication sections, each of which defines a negative structural feature that, in turn, defines the shape of a respective optical element. Individual portions of a replication material can be applied to a substrate (e.g., the optics wafer OW) and/or the replication tool. Each individual portion is associated with a respective negative structural feature. The replication tool is moved relative to the substrate (e.g., the optics wafer OW) to shape the individual portions of the replication material. The replication material then is hardened to form the optical elements (e.g., the lens elements 26), each of which is discrete, is optically transparent, and is attached to the substrate (e.g., the optics wafer OW). Further details of the replication process according to some implementations are described in the foregoing published application, which is incorporated herein by reference.

During the replication process, the substrate (e.g., the optics wafer OW) onto which the replicated features (e.g., the lens elements 26) are to be formed can be held, for example, by a vacuum chuck, in which air is pumped from a cavity behind the substrate, and atmospheric pressure provides the holding force. In a double-sided replication process, the replicated features are formed on a first surface of the substrate, and then the substrate is turned over and placed on the vacuum chuck, but with its opposite surface facing the replication tool so that the replicated features can be formed on the second surface as well. The replicated features on the second surface of the substrate may be the same as, or different from, the replicated features on the first surface of the substrate.

As described in the following paragraphs, the vacuum chuck can be arranged so that mechanical forces are applied substantially over most of the surface of the optics wafer OW (or other substrate) during the replication process. In particular, the vacuum chuck can be used to hold the optics wafer OW (or other substrate) during the replication process when lens elements 26 or other replicated features are formed on the second surface of the optics wafer OW (or other substrate) after lens elements 26 or other replicated features have been formed on the first surface of the optics wafer OW (or other substrate).

As illustrated in FIG. 3, the vacuum chuck 40 includes a ring-shaped vacuum channel (e.g., groove) 42 at its surface near the periphery of the chuck. Vacuum chuck 40 includes a large recessed area 44 in its center portion. Recessed area 44 can be designed to be slightly smaller than the size of a wafer (e.g., an optics wafer OW) that is to be held by the chuck 40. Recessed area 44 includes transparent windows 48 to facilitate viewing of the underside of the optics wafer OW (or other substrate) using a microscope located below the vacuum chuck. In the illustrated example, the vacuum is provided through ring-shaped vacuum groove 42. In some case, a center vacuum pin 50 also can be connected to the vacuum lines. In some implementations, the entire recessed area 44 is placed under vacuum.

Figure 4:
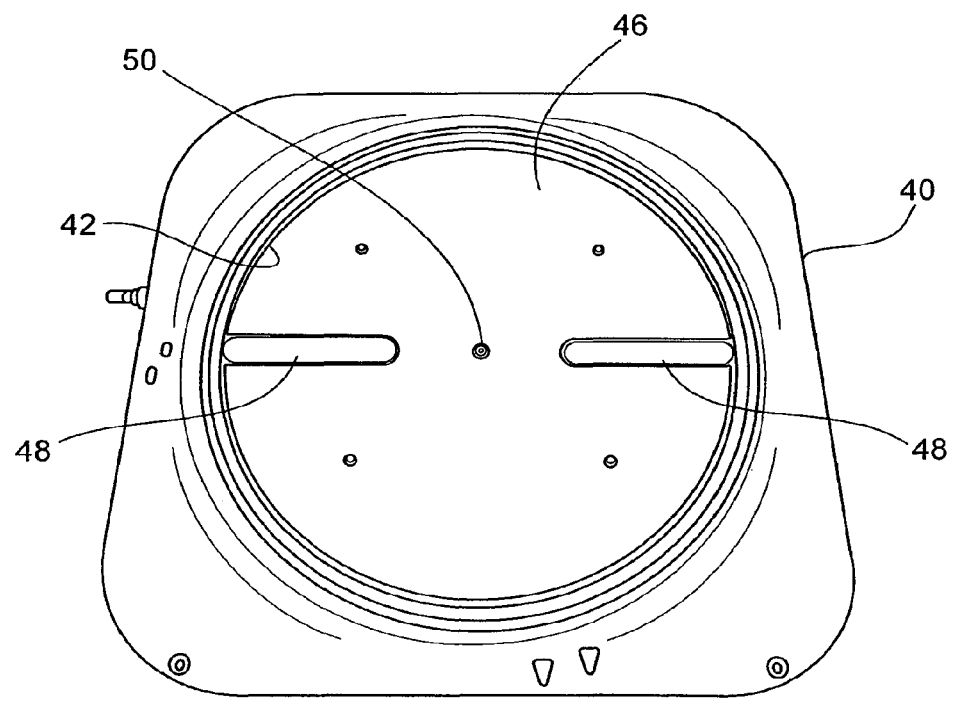
FIG. 4 illustrates the first vacuum chuck with a silicone mat or other soft material in a central recessed area.

As illustrated in FIG. 4, the recessed area (44 in FIG. 3) is covered with a soft material such as a mat 46 composed of silicone. In some implementations, the recessed area is covered with a Si-based organic, elastomeric polymer such as polydimethylsiloxane (PDMS) or some other polymeric organosilicon compound within the group commonly referred to as silicones. Other materials with similar mechanical and chemical properties may be used. Preferably, the material 46 covering the recess 44 is non-sticky, relatively soft, elastic and non-abrasive. For some applications, the thickness of the mat 46 should be at least 0.2 mm, and in some cases, at least 0.5 mm. More generally, the thickness of the material 46 may depend on the height of the lens elements 26, the depth of the recess 44 and the extent of any bending of the wafer. In some implementations, the thickness of the material 46 is in the range of 0.5 mm to 2 mm.

Figure 5:
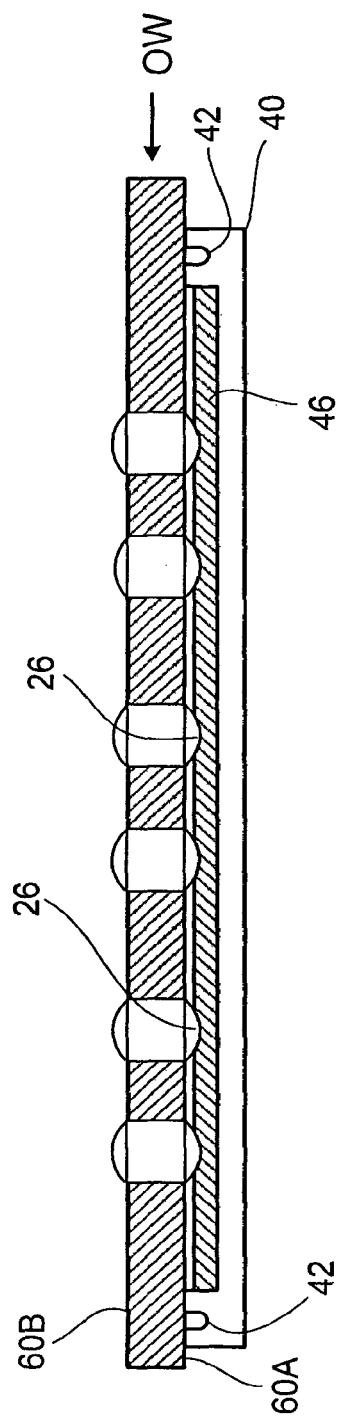
FIG. 5 is a cross-sectional view of an optics wafer held by the first vacuum chuck of FIG. 4.
Figure 6:
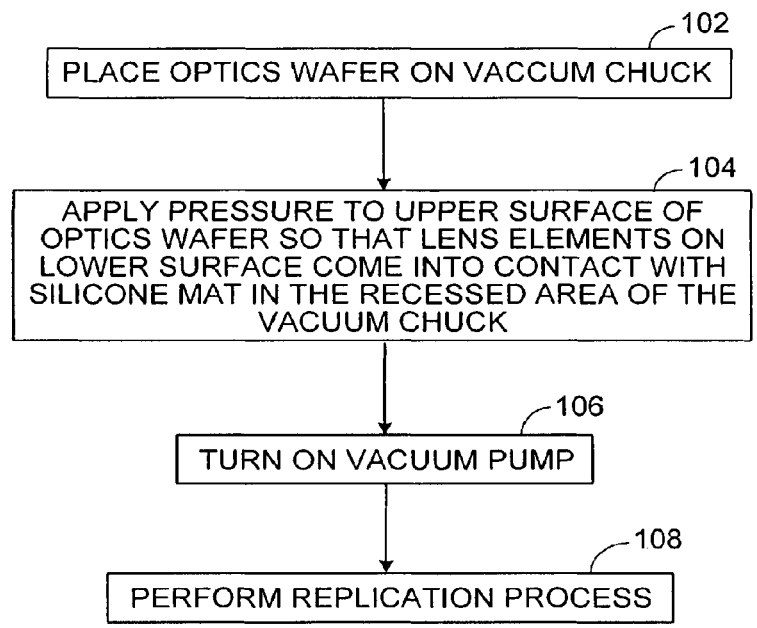
FIG. 6 is a flow chart of a method that includes use of the first vacuum chuck of FIG. 4.

As shown in FIGS. 5 and 6, optics wafer OW is placed on the vacuum chuck 40 with its first surface 60A facing the vacuum chuck and its second (opposite) surface facing away from the vacuum chuck (block 102 of FIG. 6). Optics wafer OW already may have replicated or other features (e.g., lens elements 26) on the surface 60A that faces vacuum chuck 40. In this state, slight bending of the optics wafer OW may cause the edges of the wafer to be elevated by as much as several mm above the surface of vacuum chuck 40. Next, pressure is applied to second surface 60B of optics wafer OW either manually or using automated or semi-automated equipment so that lens elements 26 on first surface 60A are within recessed area 44 of vacuum chuck 40 and come into contact with the soft material 46 (e.g., the silicone mat) covering the recessed area (block 104). The vacuum pump is then turned on (block 106), which causes the optics wafer OW to be held in place over the vacuum chuck 40 with little or no bending. With optics wafer OW held in place on vacuum chuck 40, the replication process can be performed (block 108), including bringing the replication tool into contact with second surface 60B of optics wafer OW to form lens elements 26 on the second surface. In some implementations, the entire process of FIG. 6 is automated.

The foregoing technique can, in some cases, provide greater mechanical support across the surface of the optics wafer OW so that there is little or no bending of the wafer while it is held in place by the vacuum chuck 40 during the replication process for formation of the lens elements 26 on the second surface 60B of the wafer. Using a non-sticky, relatively soft, elastic and non-abrasive material 46 to cover the recessed area 44 can, in some cases, allow the lens elements 26 on the first surface 60A to contact the material 46 without damaging the lens elements 26 and without any residual material 46 remaining on the lens elements 26 when the optics wafer OW is removed from the vacuum chuck 40. Also, it can allow the material 46 to return substantially to its original shape after the optics wafer OW is removed from the vacuum chuck 40 so that the vacuum chuck can be used to process another wafer.

Although the technique of FIG. 6 is described in connection with a replication process for an optics wafer OW, it also can be used in connection with other types of wafers to which a double-sided replication process is to be applied.

Figure 7:
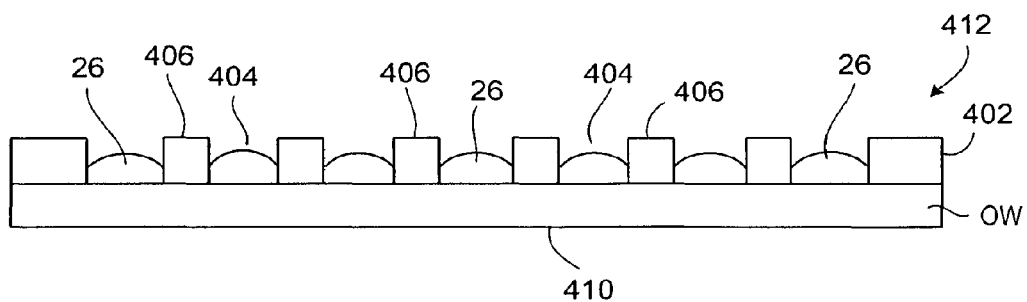
FIG. 7 is a cross-sectional view of an optics wafer attached to a frame to reduce damage to the optics wafer when it is held by a vacuum chuck.

Some implementations use other techniques instead of (or in addition to) a silicone mat or other non-sticky, relatively soft, elastic and non-abrasive material 46 to protect lens elements 26 on optics wafer OW when it is placed on the vacuum chuck 40. For example, as shown in FIG. 7, a relatively sturdy stencil frame 402 can be aligned with and attached to optics wafer OW so as to protect the lens elements from damage while the optics wafer is held by the vacuum chuck. Frame 402 can be composed, for example, of a printed circuit board (PCB) material such as FR4, which is a grade designation assigned to glass-reinforced epoxy laminate material. Frame 402 can be made, for example, by a micromachining process. Frame 402, which can be formed as a unitary piece, includes openings 404 whose diameter preferably is just slightly larger than the diameter of the lens elements 26. The height of frame 402 preferably is at least somewhat greater than the height of lens elements 26. Thus, each lens element 26 is surrounded by a portion 406 of frame 402. Frame 402 allows optics wafer OW to be held by a vacuum chuck so that lens elements can be replicated on the second side of the optics wafer without damaging the lens elements 26 previously replicated on its first side. At the same time, the support provided by frame 402 can help reduce warping and bowing of optics wafer OW.

In a particular implementation, frame 402 is held by a flat chuck with an external vacuum source, and optics wafer OW is held by a second chuck. Alignment equipment is provided to align frame 402 with optics wafer OW with respect to one another. Adjustments in position can be made, if needed, and one or both of the vacuum chucks are moved toward each other so that lens elements 26 on a first surface of optics wafer OW are aligned with and fit within openings 404 in frame 402 to form a wafer-frame stack 412, as shown in in FIG. 7. For example, in some implementations, frame 402 is lowered onto optics wafer OW. Alignment of optics wafer OW and frame 402 can be fixed, for example, using clamps or tape. The vacuum chucks then can release the wafer-frame stack, which can be moved for further processing (e.g., cleaning), if needed. The wafer-frame stack subsequently is placed on a vacuum chuck, and lens elements are formed by replication or another technique on the second side 410 of optics wafer OW.

After the individual wafers PW, SW and OW are provided, the wafers are aligned and bonded together to form the wafer stack 10 (FIG. 2). Initially, two of the wafers can be placed on one another to form a sub-stack. For example, in some implementations, the spacer wafer SW is placed on the substrate wafer PW such that the active optical components 22, 24 on the substrate wafer PW are located within the openings 36 in the spacer wafer SW. An adhesive can be provided on one or both of the contacting surfaces at the interface between the spacer wafer SW and the substrate wafer PW.

To form the stack 10, the optics wafer OW is aligned with and placed on the sub-stack such that its lower surface is on the upper surface of the spacer wafer SW. Here too, an adhesive can be disposed on one or both of the contacting surfaces at the interface between the spacer wafer SW and the optics wafer OW.

In some implementations, one or more of the wafers or the sub-stack may be held by a vacuum chuck during the alignment and attachment steps. Furthermore, in some cases, some or all of these steps may take place in a mask aligner, where individual wafers or a sub-stack are held by a vacuum chuck. To hold the optics wafer OW, for example, a vacuum chuck as described in connection with FIGS. 3-5 can be used. The following paragraphs describe an example of a vacuum chuck that can be used to hold the substrate wafer PW or a sub-stack that includes the substrate wafer PW.

Figure 8A:
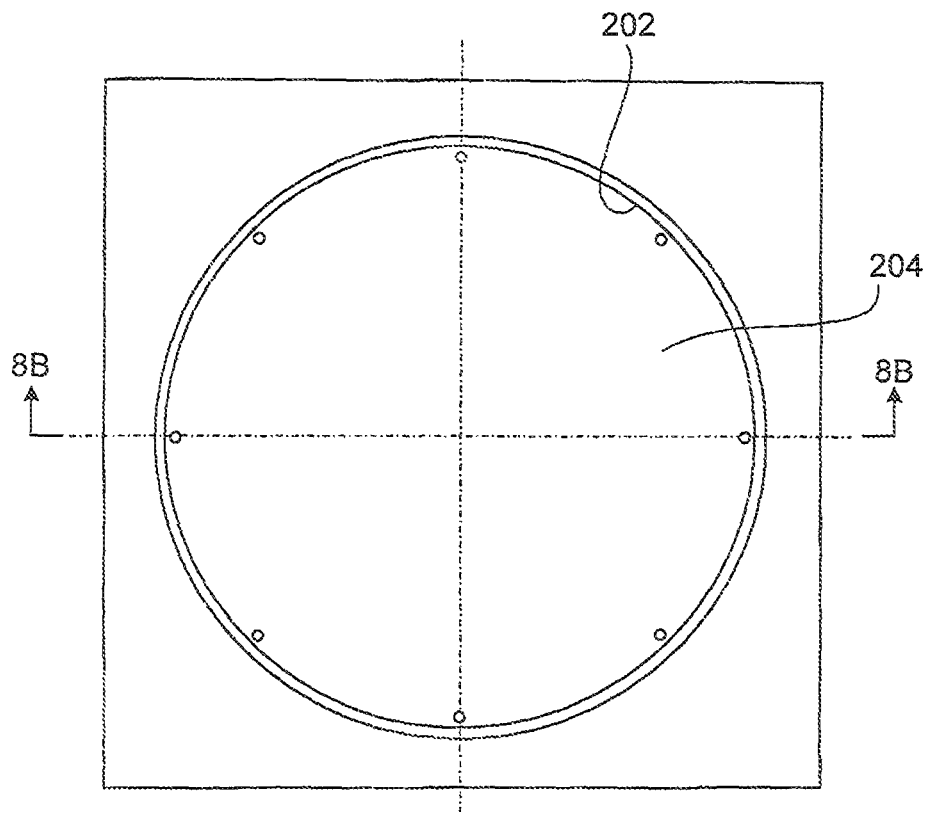
FIGS. 8A and 8B are, respectively, a top view and side view of a second vacuum chuck.
Figure 8B:
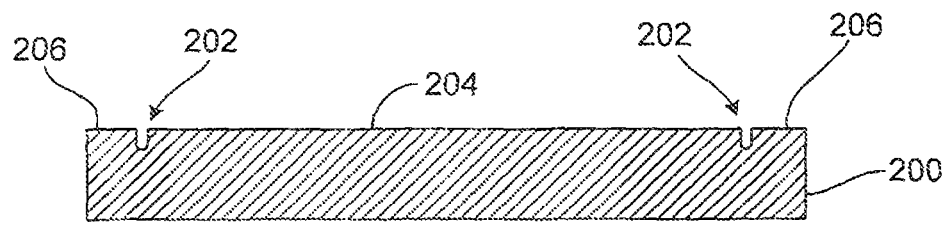

FIGS. 8A and 8B illustrate an example of a vacuum chuck 200 that includes a ring-shaped vacuum groove 202. With the exception of the groove 202, the top surface of the vacuum chuck 200 can be substantially planar. In particular, the center inner region 204 of the vacuum chuck's top surface is at substantially the same height as the peripheral region 206 of the top surface.

Figure 9:
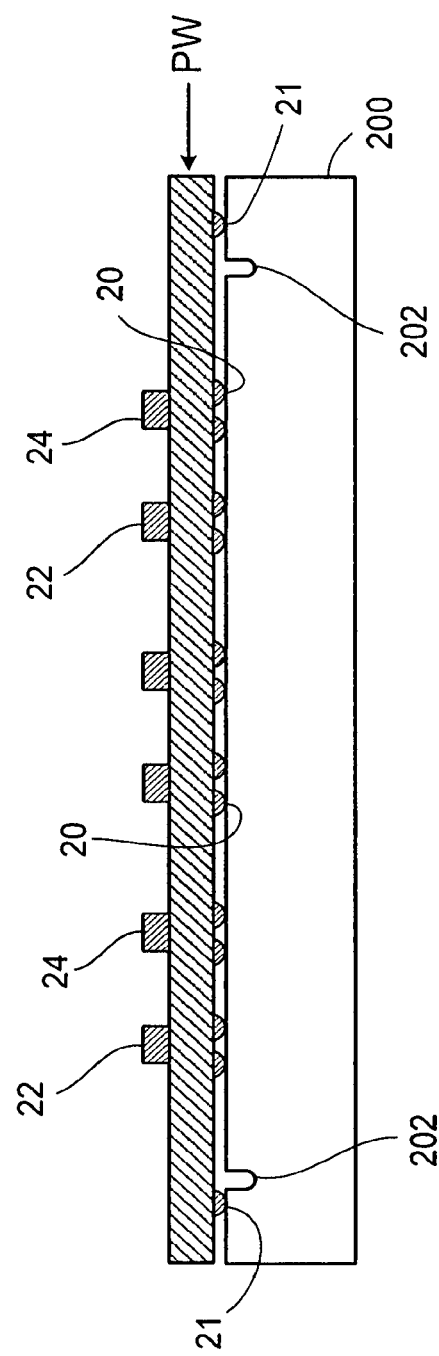
FIG. 9 is a cross-sectional view of a substrate wafer held by the second vacuum chuck.

As described above, substrate wafer PW includes bonding pads 20 on its back surface. When substrate wafer PW and spacer wafer SW are to be attached to one another, substrate wafer PW can be mounted on vacuum chuck 200 such that bonding pads 20 face the upper surface of the vacuum chuck. In addition to bonding pads 20, the backside of substrate wafer PW includes a sealing ring 21 near the periphery of the wafer (see FIG. 9). Sealing ring 21 should be substantially the same height as bonding pads 20 and can be formed during the same process steps as the bonding pads. For example, in some implementations, bonding pads 20 and sealing ring 21 are composed of electrical contacts and solder paste. The electrical contacts, such as copper or other conductive layers, can be laminated as a foil and applied by galvanic growth using a screening process. The solder paste subsequently can be added over the electrical contacts also using a screen printing process. Whereas bonding pads 20 are discrete structures associated, for example, with the individual active components 22, 24, sealing ring 21 near the edge of substrate wafer PW acts as a seal when vacuum is applied through the vacuum channel 202. Therefore, sealing ring 21 should be located sufficiently close to the periphery of substrate wafer PW so that, when the wafer is placed on vacuum chuck 200, the sealing ring is outside the ring-shaped vacuum groove 202. Accordingly, the diameter of sealing ring 21 should be slightly larger than the diameter of ring-shaped vacuum groove 202.

Figure 10:
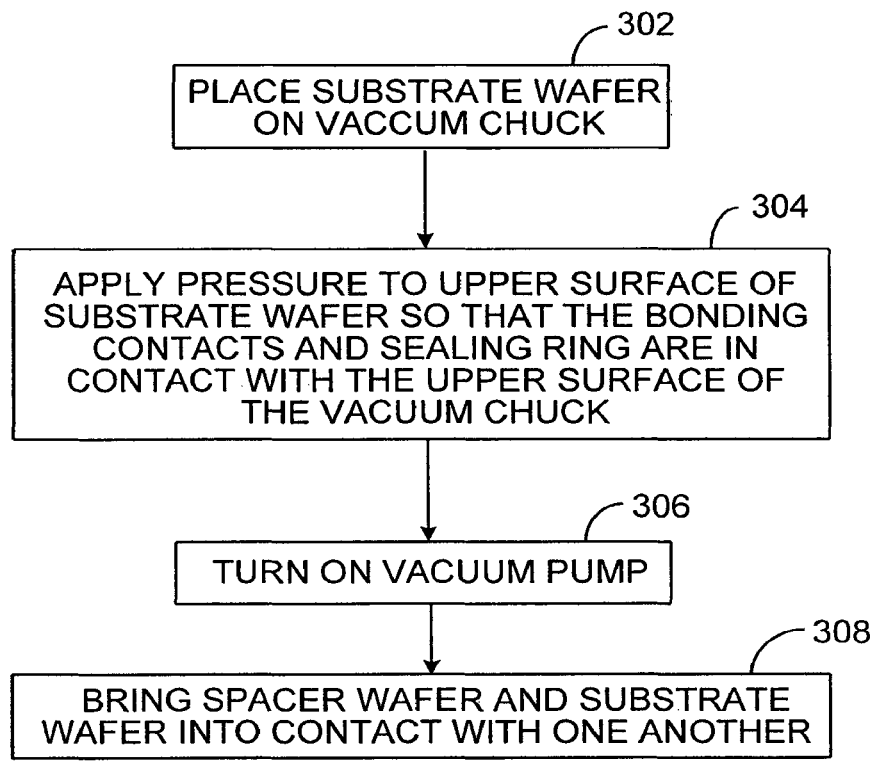
FIG. 10 is a flow chart of a method that includes use of the second vacuum chuck.

As indicated by FIG. 10, substrate wafer PW is placed on vacuum chuck 200 with its backside surface facing the vacuum chuck and its front (opposite) surface facing away from the vacuum chuck (block 302). In particular, substrate wafer PW is positioned on vacuum chuck 200 such that bonding pads 20 face the central inner region of the chuck's surface (i.e., the area on the chuck's surface that is bounded by the vacuum groove 202), and such that sealing ring 21 faces the outer region of the chuck's surface (i.e., near its periphery, outside the area defined by the vacuum groove 202). In this state, slight bending of the substrate wafer PW may cause the edges of the wafer to be elevated by as much as several mm (e.g., 4 mm) above the surface of vacuum chuck 200. Next, pressure is applied to the front surface of substrate wafer PW either manually or using automated or semi-automated equipment so that all, or substantially all, of the bonding contacts 20, as well as sealing ring 21, are in contact with the upper surface of vacuum chuck 200 (block 304). The vacuum pump is then turned on (block 306), which causes substrate wafer PW to be held in place on the vacuum chuck 200 with little or no bending. With substrate wafer PW held in place by vacuum chuck 200, spacer wafer SW and substrate wafer PW can be brought into contact for attachment to one another (block 308). In some implementations, the entire process of FIG. 6 is automated.

The foregoing technique can, in some cases, provide greater mechanical support across the surface of the substrate wafer PW so that there is little or no bending of the wafer while it is held in place by the vacuum chuck 200 during alignment and attachment.

Although the technique of FIG. 10 is described in connection with holding a substrate wafer PW for attachment to a spacer wafer SW, the technique also can be used to hold other types of wafers or a sub-stack for attachment to another wafer or sub-stack. For example, vacuum chuck 200 can be used to hold a sub-stack composed of substrate wafer PW and spacer wafer SW for attachment to optics wafer OW, which can be held by vacuum chuck 40 (see FIGS. 3 and 4). Similarly, vacuum chuck 200 can be used to hold substrate wafer PW for attachment to a sub-stack composed of spacer wafer SW and optics wafer OW, which is held by vacuum chuck 40 in the manner described above.

FIGS. 11A through 11C illustrate an example of steps in formation of a wafer stack, where a substrate wafer PW is placed onto a sub-stack composed of an optics wafer OW and spacer wafer SW. As shown in FIG. 11A, spacer wafer SW is placed on optics wafer OW to form a sub-stack. Thermally-curing adhesive 104 can be present at the contact interfaces. Spacer wafer SW includes openings (e.g., through-holes) near its periphery which are overfilled with a UV-curable adhesive material 124, such as a UV-curable glue, epoxy or other adhesive. The sub-stack can be loaded into a mask aligner and held, for example, by a recessed vacuum chuck such as vacuum chuck 40 (see FIGS. 3 and 4).

Figure 12:
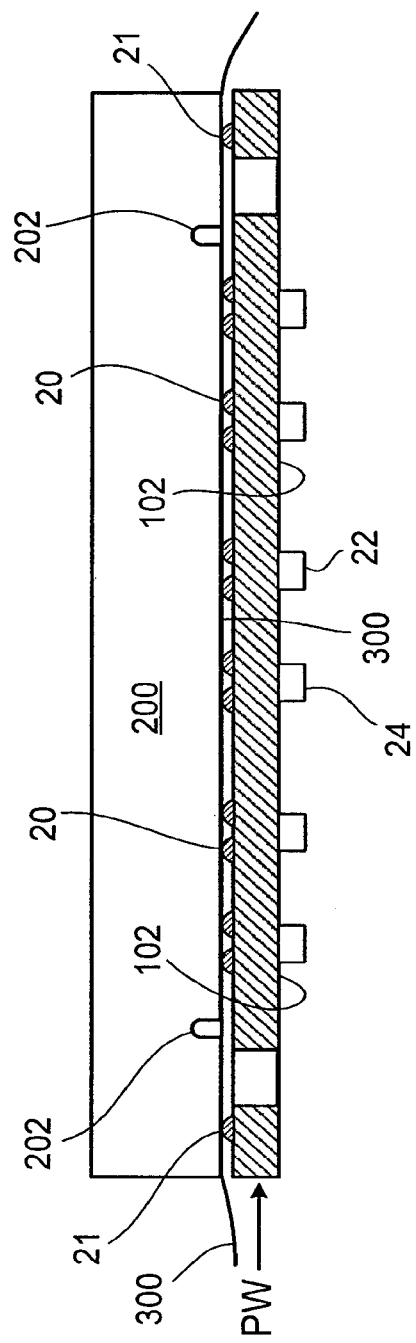
FIG. 12 illustrates a substrate wafer mounted to dicing tape and held by a vacuum chuck.

As shown in FIG. 11B, substrate wafer PW can include through-holes 130 that extend from one surface of substrate wafer SW to its opposite surface. Substrate wafer PW, which can be held by another chuck (e.g., vacuum chuck 200 in FIG. 8A), is aligned with optics wafer OW and is placed on spacer wafer SW, as shown in FIG. 11C. Thermally-curing adhesive 102 can be present at the contact interfaces. Placing substrate wafer SW on the sub-stack causes the UV-curable adhesive material 124 that already overfills the openings near the periphery of spacer wafer SW to fill the corresponding through-holes 130 near the periphery of substrate wafer PW. In some cases, however, the UV-curable adhesive material 124 may flow to the back side of substrate wafer PW, which can contaminate the vacuum chuck. In order to prevent the occurrence of such contamination, substrate wafer PW can be mounted, for example, on dicing tape 300 before being placed on the vacuum chuck (see FIG. 12). This allows dicing tape 300 to be disposed between the back side of substrate wafer PW and the surface of the vacuum chuck. In this way, un-cured adhesive material 124 can be prevented from contaminating the vacuum chuck 200. Dicing tape 300 can be made, for example, of PVC, polyolefin, or polyethylene backing material, with an adhesive on the surface to which substrate wafer PW is mounted. In some cases, the thickness of dicing tape 300 is on the order, for example, of 75 to 150 µm, although other thicknesses may be appropriate for other implementations.

After substrate wafer PW is placed on the sub-stack (i.e., on spacer wafer SW, which is attached to optics wafer OW), UV radiation can be directed toward the surface of substrate wafer PW so as to cure adhesive material 124 and locally bond the wafers to one another. Following the local UV cure, the entire wafer stack can be transferred to an oven so as to cure the thermally-curable adhesive materials 102, 104. After removal from the oven, the wafer stack can be separated (e.g., diced) into separate modules. After dicing wafer stack 10 into individual modules, the dicing tape 300 can be removed from the bottom surface of the modules.

The dicing tape 300 may, thus, serve several functions in various implementations. First, as explained above, it can prevent un-cured adhesive material 124 from contaminating the vacuum chuck that holds the substrate wafer PW. Second, in some implementations, one or more through-holes may be provided in substrate wafer PW to facilitate venting during a reflow process so as to release pressure build-up. Such reflow processes may be performed during the subsequent manufacture of devices (e.g., a mobile phone) in which one or more of the modules are incorporated. When substrate wafer PW is held by chuck 200, the dicing tape 300 can cover the pressure-release hole(s) so as to facilitate formation of a good vacuum seal. A third function of the dicing tape 300 is to facilitate the dicing process.

The techniques described above can be used, in some implementations, to alleviate bending of the wafer regardless of whether the bending is concave or convex. Although the techniques are described in connection with particular types of wafers, the techniques also can be used to in connection with other types of wafers or wafer sub-stacks.

A number of implementations have been described. Nevertheless, it will be understood that various modifications may be made without departing from the spirit and scope of the invention. Accordingly, other implementations are within the scope of the claims.

What is claimed is:

1. A method of forming a wafer stack, the method comprising:
   using a vacuum chuck to hold a wafer sub-stack that comprises a plurality of wafers stacked on one another, the vacuum chuck including a first surface with a vacuum groove, wherein the first surface of the vacuum chuck includes a central region that is encircled by the vacuum groove and an outer region that encircles the vacuum groove, and wherein the central region and the outer region of the first surface of the vacuum chuck are at substantially the same height, wherein a first surface of the wafer sub-stack that faces the vacuum chuck includes a plurality of features thereon that contact the central region of the vacuum chuck's first surface, the first surface of the wafer sub-stack further including a sealing ring that contacts the outer region of the vacuum chuck's first surface; and
   bringing a second wafer into contact with a second surface of the wafer sub-stack, wherein the second surface of the wafer sub-stack is on a side of the wafer sub-stack opposite its first surface.

2. The method of claim 1 wherein the features on the first surface of the wafer sub-stack comprise bonding pads.

3. The method of claim 2 wherein each of the bonding pads and the sealing ring comprises an electrical contact and solder paste.

4. The method of claim 1 wherein each of the features and the sealing ring is composed of the same materials and extends substantially the same distance beyond the first surface of the wafer sub-stack.

5. The method of claim 1 including generating a vacuum to hold the wafer sub-stack to the vacuum chuck.

6. A method of forming a wafer stack, the method comprising:
   holding, by a first vacuum chuck, a wafer sub-stack that comprises a plurality of wafers stacked on one another, the first vacuum chuck including a first surface with a vacuum groove, wherein the first surface of the first vacuum chuck includes a central region that is encircled by the vacuum groove and an outer region that encircles the vacuum groove, and wherein the central region and the outer region of the first surface of the first vacuum chuck are at substantially the same height, wherein a first surface of the wafer sub-stack that faces the first vacuum chuck includes a plurality of features thereon that contact the central region of the vacuum chuck's first surface, the first surface of the wafer sub-stack further including a sealing ring that contacts the outer region of the first vacuum chuck's first surface;
   holding, by a second vacuum chuck, a second wafer, wherein a first surface of the second wafer that faces the second vacuum chuck includes features that project toward the second vacuum chuck, and wherein the second vacuum chuck includes a central recessed surface on which a non-sticky, soft, elastic and non-abrasive material is disposed, and wherein the features of the second wafer on its first surface are in contact with the non-sticky, soft, elastic and non-abrasive material, and wherein part of the first surface of the second wafer near its periphery is in contact with an elevated section of the second vacuum chuck that includes a vacuum channel; and
   bringing the second wafer into contact with a second surface of the wafer sub-stack, wherein the second surface of the wafer sub-stack is on a side of the wafer sub-stack opposite its first surface.

7. The method of claim 6 wherein the non-sticky, soft, elastic and non-abrasive material is a silicone mat.

8. The method of claim 6 wherein the features on the wafer sub-stack comprise bonding pads composed of the same materials as the sealing ring.

9. The method of claim 8 wherein the features on the second wafer comprise lens elements.

10. A method of forming a wafer stack, the method comprising:
    mounting a first wafer on dicing tape, wherein a first surface of the first wafer includes a plurality of features thereon and a sealing ring encircling the plurality of features, wherein the plurality of features and the sealing ring extend substantially the same distance beyond the first surface of the first wafer; and
    using a vacuum chuck to hold the first wafer, wherein the dicing tape is disposed between the vacuum chuck and the first wafer, wherein the vacuum chuck includes a first surface with a vacuum groove, wherein the first surface of the vacuum chuck includes a central region that is encircled by the vacuum groove and an outer region that encircles the vacuum groove, and wherein the central region and the outer region of the first surface of the vacuum chuck are at substantially the same height, wherein the plurality of features on the first surface of the first wafer contact the central region of the vacuum chuck's first surface, and the sealing ring contacts the outer region of the vacuum chuck's first surface.

11. The method of claim 10 including bringing a second wafer into contact with a second surface of the first wafer, wherein the second surface of the first wafer is on a side of the first wafer opposite its first surface.

12. The method of claim 11 wherein the first wafer includes one or more through-holes, and the second wafer includes UV-curable adhesive material that enters the one or more through-holes when the first and second wafers are brought into contact with one another.

13. The method of claim 10 wherein the plurality of features on the first surface of the first wafer comprise bonding pads, and wherein each of the bonding pads and the sealing ring comprises an electrical contact and solder paste.

\* \* \* \* \*